United States Patent
Jeong et al.

(10) Patent No.: US 8,663,388 B2
(45) Date of Patent: Mar. 4, 2014

(54) METHOD OF MANUFACTURING SINGLE CRYSTAL WIRE AND OTHER SINGLE CRYSTAL METALLIC ARTICLES

(75) Inventors: Se Young Jeong, Busan (KR); Chae Ryong Cho, Busan (KR); Sang Eon Park, Busan (KR); Sung Kyu Kim, Busan (KR)

(73) Assignee: Korea Electrotechnology Research Institute (KR)

( * ) Notice: Subject to any disclaimer, the term of this patent is extended or adjusted under 35 U.S.C. 154(b) by 1095 days.

(21) Appl. No.: 12/436,754

(22) Filed: May 6, 2009

(65) Prior Publication Data

US 2009/0211516 A1    Aug. 27, 2009

Related U.S. Application Data

(60) Division of application No. 11/726,272, filed on Mar. 21, 2007, now abandoned, which is a continuation of application No. PCT/KR2005/003050, filed on Sep. 15, 2005.

(30) Foreign Application Priority Data

Sep. 21, 2004 (KR) .................. 10-2004-0075550

(51) Int. Cl.
   *C30B 11/00* (2006.01)
(52) U.S. Cl.
   USPC .................. 117/73; 117/75; 117/81; 117/82; 117/83; 117/13
(58) Field of Classification Search
   USPC .................. 117/73, 75, 81, 82, 83
   See application file for complete search history.

(56) References Cited

U.S. PATENT DOCUMENTS

| | | | |
|---|---|---|---|
| 1,793,672 A * | 2/1931 | Bridgman | ............ 117/83 |
| 4,792,369 A | 12/1988 | Ogata et al. | |

(Continued)

FOREIGN PATENT DOCUMENTS

| | | |
|---|---|---|
| JP | 60-092011 A | 5/1985 |
| JP | 61-146796 A | 7/1986 |

(Continued)

OTHER PUBLICATIONS

PCT International Search Report / PCT/KR2005/003050, 2005.

*Primary Examiner* — Matthew Song
(74) *Attorney, Agent, or Firm* — Park & Associates IP Law, P.C.

(57) ABSTRACT

Disclosed are a single crystal wire and other single crystal articles, and a manufacturing method thereof. The method comprises the steps of: placing into a growth crucible at least one metal selected from the group consisting of gold, copper, silver, aluminum and nickel; heating and melting the metal placed in the growth crucible; growing a single crystal using metal crystal as a seed by Czochralski or Bridgman method; cutting the grown single crystal by electric discharge machining; and machining the cut single crystal and producing a wire or other articles such as a ring. In the method, the grown metal single crystal is cut into a disc-shaped piece by electric discharge machining. The piece is transformed into a single crystal wire or other articles by wire-cut electric discharge machining, and the single crystal wire can be used as a ring, a pendant, or a wire for high-quality cables for audio and video systems. Also, the single crystal formed into the disc-shaped piece by electric discharge machining can be used as a substrate and a target for deposition.

15 Claims, 7 Drawing Sheets

(56) References Cited

U.S. PATENT DOCUMENTS

| | | | |
|---|---|---|---|
| 4,951,380 A * | 8/1990 | Smith | 29/600 |
| 4,976,792 A * | 12/1990 | Sawada | 148/404 |
| 5,161,602 A * | 11/1992 | Chang et al. | 164/519 |
| 5,491,321 A * | 2/1996 | Stuart et al. | 219/137.61 |
| 5,629,236 A | 5/1997 | Wada et al. | |
| 5,667,585 A | 9/1997 | Fukuda et al. | |
| 5,733,389 A | 3/1998 | Takahashi et al. | |
| 5,753,380 A * | 5/1998 | Takahashi et al. | 428/651 |
| 5,827,366 A | 10/1998 | Watanabe | |
| 6,315,827 B1 | 11/2001 | Kurosaka et al. | |
| 6,683,256 B2 | 1/2004 | Kao | |
| 6,700,234 B2 * | 3/2004 | Hashimoto et al. | 310/45 |
| 2001/0052467 A1 * | 12/2001 | Pinckney | 205/122 |
| 2004/0061063 A1 * | 4/2004 | Sherohman et al. | 250/370.12 |
| 2004/0213639 A1 * | 10/2004 | Ueda et al. | 407/119 |
| 2004/0221816 A1 * | 11/2004 | Suzuki | 118/723 MW |

FOREIGN PATENT DOCUMENTS

| | | | | |
|---|---|---|---|---|
| JP | 61-163194 A | | 7/1986 | |
| JP | 63210641 A | * | 9/1988 | B21C 1/00 |
| JP | 08-106819 A | | 4/1996 | |
| JP | 08-298028 A | | 11/1996 | |

* cited by examiner

| Element | poly crystal Cu | single crystal Cu |
|---|---|---|
| Cu-325 | BAL. | BAL |
| Ag-328 | 0.009645 | 0.001162 |
| Al-396 | 0 | 0.00189 |
| As-189 | 0.00362 | 0 |
| Cd-229 | 0 | 0 |
| Co-345 | 0.000085 | 0 |
| Cr-425 | 0 | 0 |
| Fe-372 | 0.006113 | 0.000062 |
| Mg-382 | 0.00111 | 0.000711 |
| Mn-403 | 0 | 0 |
| Ni-341 | 0.006418 | 0 |
| P-178 | 0.06452 | 0.00102 |
| Pb-220 | 0.03608 | 0 |
| S-181 | 0.00554 | 0.00044 |
| Sb-207 | 0.004905 | 0.00267 |
| Se-196 | 0.00029 | 0 |
| Si-288 | 0.00046 | 0.00163 |
| Sn-318 | 0.02602 | 0.00204 |
| Zn-335 | 0.01047 | 0 |

FIG. 6

METHOD OF MANUFACTURING SINGLE CRYSTAL WIRE AND OTHER SINGLE CRYSTAL METALLIC ARTICLES

REFERENCE TO RELATED APPLICATIONS

This is a divisional of application of U.S. patent application Ser. No. 11/726,272 filed on Mar. 21, 2007, now abandoned, which is a continuation of International Patent Application PCT/KR2005/003050 filed on Sep. 15, 2005, which designates the United States and claims priority of Korean Patent Application No. 10-2004-0075550 filed on Sep. 21, 2004.

FIELD OF THE INVENTION

The present invention relates to a single-crystal wire and other single-crystal articles, and a manufacturing method thereof, and more particularly to a single-crystal wire and other articles manufactured by growing a single crystal through a single crystal growth method and machining or otherwise producing the grown single crystal into a wire or other shapes, as well as a manufacturing method thereof.

BACKGROUND OF THE INVENTION

The concept of high-quality cables and related metallic articles was not generally established until the 1970s, but since the development of oxygen-free copper (hereinafter, referred to as "OFC"), the development of cables has rapidly progressed.

Particularly in the case of wire cables making connections in audio systems, etc., it is well known that the quality of cables influences the quality of sound. Thus, replacement of low-quality cables with high-quality cables can provide a great improvement in sound quality.

When such wires are applied with alternating current, an alternating magnetic field will occur, which acts as resistance to the alternating current. Particularly, the higher the frequency, the higher the resistance, and this property is called "inductance". In the case of cables, if coated wires are coiled in a circular form or formed with positive and negative terminals, the inductance will increase, resulting in a reduction in the purity of sound. However, if coated wires are formed with positive and negative terminals and then twisted like a rope, the inductance will decrease instead, resulting in an increase in the purity of sound.

In general, when cables are twisted, the inductance will decrease but the capacitance will increase to make the frequency narrower and the sound muddy. Although it is a clear fact that the sound quality of audio systems differs depending on the cables used, the reason therefor has not yet been clearly established.

For example, an increase in the purity of wires leads to an increase in the purity of sound but generally results in an increase in direct current resistance, which may also reduce the cable's energy. Although the sound quality of cables is influenced by the material and physical properties of the wires themselves, it is also highly influenced by the covering material and crystalline structure of wires, the inductance, capacitance and skin effect caused by terminal processing, and the impedance between audio systems.

Thus, due to the properties of the wires, OFC cables having a purity of 99.99% frequently have better sound quality than 6N copper wire cables having a purity of 99.9999%. Metal conductors for the wires include silver, gold, copper and aluminum, with its electrical conductivity decreasing in descending order thereof. Among them, copper is most frequently used as a conductor, because it is inexpensive and has good electrical conductivity and processability.

Conventional copper wires have a standard purity of 3N (99.9%), and during production, oxygen is blown to increase the workability thereof, while copper produced in an atmosphere having no oxygen is called "OFC". Other examples of copper wires include 6N (99.9999%), 7N (99.99999%), etc., according to the extent of removal of metals and sulfur, which are impurities other than oxygen. Prior methods for manufacturing copper wires will now be described.

The production of tough pitch copper (hereinafter, referred to as "TPC") uses a general copper production method, which comprises the steps of introducing oxygen to melt copper, and rapidly cooling the melted copper. This method is suitable for mass production and produces a 3N-purity copper containing sulfur and cuprous oxide and having an oxygen content of 3000-4000 ppm and a purity of 99.9%.

OFC is copper from which the development of high-purity copper started. The OFC is a 4N (99.99%) product which has an oxygen content reduced to less than 10 ppm by removing a cuprous oxide impurity, unlike the existing TPC process utilizing oxygen blown to cool the molten copper. The use of the OFC enables a muddy sound to be removed and the purity of sound to be increased, thus improving the sound clarity.

Linear crystal oxygen-free copper (hereinafter, referred to as "LC-OFC") was developed based on the theory that every factor reducing the sound quality exists at boundaries between metal crystals. When copper is rapidly cooled in a melted state, it will have a fine crystal structure, in which case an increase in crystals will increasingly interfere with signal transmission. Based on this theory, in order for the OFC to have a unidirectional crystal structure, copper is slowly cooled to obtain large crystals, and the resulting copper crystal structure is then linearly stretched. However, during the process for linearly stretching the copper crystal structure, a mechanical stress and heat are generated in the copper, and the copper crystal structure is adversely affected, thus causing deterioration in sound quality.

Pure crystal Ohno continuous casting (hereinafter, referred to as "PCOCC") was developed to complement the shortcomings of the LC-OFC, that is, the deterioration in sound quality caused by the production of mechanical stresses and heat in the copper during the process for linearly stretching the copper crystal structure. This continuous casting method produces a single crystal structure by using an additional structure for slow cooling.

Typical examples of conductors having a high strength include LC-OFC and PCOCC, which are not subjected to a thermal treatment process in order to prevent their single crystal structure from being changed. However, as the copper wires are not subjected to the thermal treatment process, they are susceptible to a mechanical stress during the machining process and their crystal structure can be affected. To solve this shortcoming, a myu (m) conductor was developed which is slightly thermally treated to reduce the mechanical stress. In the existing technologies for developing wires, it is recognized that the structure of a single crystal acts as an important factor in manufacturing high-quality cables. However, a suitable technology for preventing the change in the single crystal structure has not yet been developed.

Silver (Ag) has excellent electrical properties, particularly a low electrical resistance, compared to copper. Thus, in audio cables, for example, silver is clearly advantageous compared to copper, particularly when in an oxidized state. In particular, copper is easily oxidized to form a coated film such as a semiconductor film, whereas oxidized silver has an advantage in that it is chemically stable, so that it can sufficiently function as a conductor.

Like the case of copper wires, silver conductors have been continuously improved through an increase in their purity and by the use of thermal treatment. Thus, it is known that recent silver wires and silver-coated OFC wires developed for exclusive use in audio systems carry more information and produce a smoother sound than silver wires for use in general telecommunication purposes.

Aluminum is a conductor having highly specific properties, like silver. It is known that aluminum is slightly higher in electrical resistance than copper but it produces a highly specific sound in a high sound range. Thus, an aluminum wire containing silver or aluminum produces a unique and elegant sound.

Accordingly, to ensure high-quality cables, technologies for manufacturing a copper, silver or aluminum wire using a high-purity single crystal needs to be further developed.

SUMMARY OF THE INVENTION

Therefore, the present invention has been made to solve the above-described problems occurring in the prior art, and it is an object of the present invention to provide a method for manufacturing a single crystal wire, which includes growing a metal single crystal using a seed crystal and then forming the grown metal single crystal into a disc-shaped piece, which is then formed into a wire.

To achieve the above object, the present invention provides a method for manufacturing a single crystal wire and other products, comprising the steps of: placing in a growth crucible at least one metal selected from the group consisting of gold, copper, silver, aluminum and nickel; heating and melting the metal placed in the growth crucible; growing a single crystal using a metal crystal as a seed by Czochralski or Bridgman method; cutting the grown single crystal by electric discharge machining, and producing the cut single crystal into a wire or other desired shapes for the intended products.

In the inventive method, the growth crucible is preferably selected from the group consisting of a graphite crucible, a boron nitride (BN) crucible, an alumina crucible, and a quartz crucible. The heating of the metal placed in the growth crucible is preferably performed using an RF induction coil or a carbon heater. Also, in the cutting step, the single crystal product is preferably formed into a disc shape. After the cutting step, the cut single crystal product is preferably produced into a wire or other shapes by wire-cut electric discharge machining, or by press machining using a mold having a press pattern. Also, the single crystal product formed into the disc shape is preferably used as a metal single crystal substrate or a metal deposition target. Also, the wire produced by the press machining can have a ring or other desired shapes.

Moreover, in the cutting step, the single crystal product is preferably formed into a cylindrical shape. Also, the cylindrical shape formed in the cutting step is preferably cut into a ring shape. Also, after the cutting step, the single crystal product is preferably subjected to a polishing or wet etching process.

Also, the wire is preferably covered with synthetic resin on the outer surface thereof, and both ends of the wire are provided with terminals.

In another aspect, the present invention provides a single crystal wire or other products manufactured by: heating and melting at least one metal selected from the group consisting of gold, copper, silver, aluminum and nickel; growing a single crystal using metal crystal as a seed by Czochralski or Bridgman method; and cutting the grown single crystal product.

Herein, the cut single crystal is preferably formed into a ring shape or a wire shape for use as a connection cable.

Also, the connection cable formed into the wire shape is preferably covered with synthetic resin on the outer surface thereof, and both ends of the connection cable are preferably provided with terminals.

According to the present invention, the metal single crystal is grown using the seed crystal and then produced into a disc-shaped piece by electrical discharge machining, and the piece is subjected to wire-cut discharge machining. Accordingly, various single-crystal wires and other products having a unidirectional crystal structure can be formed.

Also, the single-crystal wire can be used as variuos products, such as a ring, a pendant, or a conductive wire in a high-quality cable for making a connection in audio and video systems.

In addition, the single crystal product formed into the disc shape can be used as a single crystal substrate for the fabrication of thin films or a target for metal deposition.

BRIEF DESCRIPTION OF THE DRAWINGS

FIG. 6 shows GDS results for a copper single-crystal wire of the invention and a conventional polycrystal copper wire.

DETAILED DESCRIPTION OF THE INVENTION

Hereinafter, the present invention will be described in detail with reference to the accompanying drawings.

First, a metal mass to be grown, which is at least one selected from the group consisting of gold, copper, silver, aluminum and nickel, is placed into a growth crucible (BN crucible, quartz crucible, graphite crucible, alumina crucible, etc.) in which the metal mass is then melted either by induction heating using an induction coil or by a carbon heater. The growth crucible used in the present invention is either a graphite crucible or a double structure crucible in which the outer crucible is the graphite crucible and the inner crucible is one selected from among the BN crucible, the quartz crucible and alumina crucible.

The growth of a copper or silver single crystal will now be described in detail.

Since copper and silver are not chemically bonding to carbon, the graphite crucible or the double structure crucible having the graphite crucible as an outer crucible is used for the growth crucible. The reason why the growth crucible is used as a heating element is that the temperature of induction heating will be difficult to control when the amount of melted mass remaining in the crucible during the growth of a metal single crystal is reduced. Thus, it is easy in the growth of a metal single crystal to use the growth crucible as a heating element to control the temperature of the crucible itself. The growth crucible and metal mass (e.g., copper and/or silver) are induction-heated to the melting points of the metals. Since the melting points of copper and silver are 1083° C. and 962° C., respectively, they are heated to temperatures higher than the melting points by about 30° C. so as to melt them completely.

A seed crystal having the desired crystal structure is prepared and grown into a single crystal by the Czochralski method. The seed crystal is prepared in the form of a rod in each of the (100), (110) and (111) directions. The growth of the copper single crystal is performed at a temperature of 1100-1000° C., and the growth of the silver crystal is performed at a temperature of 1000-900° C. Also, the growth of each of copper and silver is performed according to the Czochralski method, in which the temperature of a liquid phase is lowered at a rate of about 1° C./min.

Although the method for growing the single crystal using the Czochralski has been described above, the Bridgman method may also be used for the growth of single crystals, and the use of the Bridgman method is also within the scope of the present invention.

Figure 1:
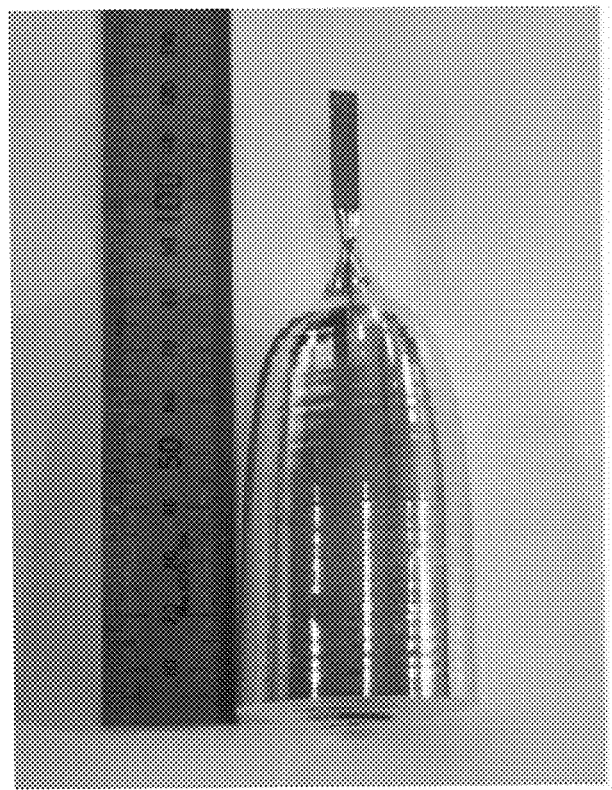
FIG. 1 is a photograph showing a copper-single crystal formed according to an embodiment of the present invention.

FIG. 1 illustrates one example of the copper single-crystal produced according to the above procedures.

Then, the formed single crystal is used to produce a wire. For this purpose, the grown high-purity single crystal is cut into a disc-shaped piece having the desired thickness by electric discharge machining. In this regard, the electric discharge machining is adopted in order to minimize deformation caused by stress to be generated in the conventional machining of copper and silver into the disc-shaped piece.

The thickness of the disc-shaped piece is determined depending on the diameter of a wire to be produced, and in the present embodiment of the invention, the disc-shaped disc was produced to have a thickness of about 1 mm.

Thus, the produced disc-shaped piece can be transformed into a 1-mm-diameter wire by wire-cut electric discharge machining. The disc-shaped piece is polished with alumina powder having a particle size of 0.3 μm in order to completely remove stresses remaining on the surface of the disc-shaped piece.

To obtain the desired wire or similar products from the disc-shaped piece after the polishing step, the disc-shaped disc is fixed using an outer mold and then cut into a wire by wire-cut electric discharge machining. To provide the wire from the disc-shaped piece, the disc-shaped piece is cut from the outside to the inside of the cross-section thereof so as to provide a wire having the desired thickness, and a separate winding process is performed to prevent twisting or distortion of the wire during the electric discharge machining.

Alternatively, the wire may also be provided by first forming a small hole in the central portion of the disc using a wire drill and then cutting the disc from the inside to the outside of the cross section thereof so as to produce a wire having the desired diameter.

Since the wire obtained according to the above process has the effect of residual stress due to the machining step, optical polishing of the wire is required. This optical polishing is performed using alumina powder in the same manner as in the polishing of the disc-shaped piece so as to remove the effect of stress remaining on the surface of the wire.

Alternatively, the effect of stress on the surface of the wire may also be removed using a hydrofluoric acid dilution. The effects of stress on the metal surface during the electric discharge machining are mostly remained in oxide films. Such oxide films can be removed through a wet etching process using a solution of $H_2O:HF=5:1$, in which the wet etching is performed for about 3 minutes.

Figure 2:
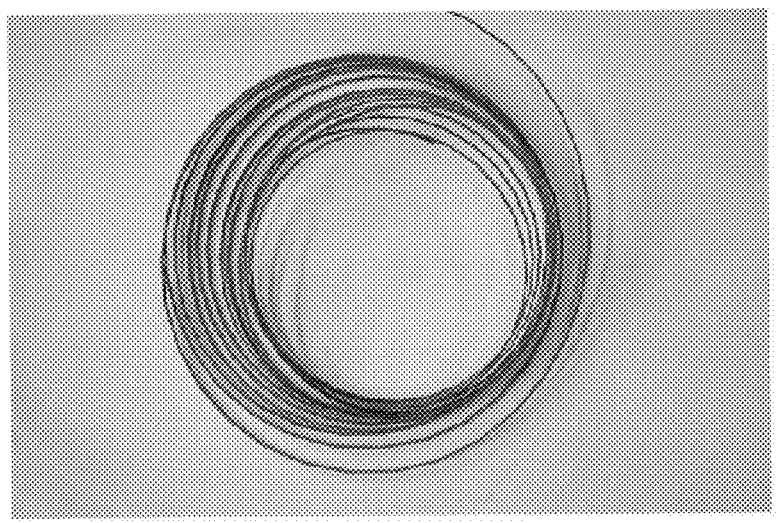
FIG. 2 is a photograph showing a wire formed according to an embodiment of the present invention.

The wire produced through this process is shown in FIG. 2.

The surface-polished or wet-etched wire can be used as a connection cable for making connections in audio systems, etc. For use as the cable, the wire is typically covered with a material on the outer surface thereof.

The process for covering the wire is performed by a known method or a manual process to make a cable. Thus, the single crystal wire product for the transmission of commercial-grade sounds and image data is produced.

Generally, the wire is covered with, for example, an insulating shrinkable tube having a diameter larger than that of the wire. Namely, for use as a sound cable, the wire is covered with a polyurethane or other insulating shrinkable tube to the required diameter so as to produce a single crystal wire product in which the wire is protected from oxidation or external stress.

Also, for use as a coaxial cable, the wire is covered sequentially with a synthetic resin coating and a natural leather coating so as to produce a single-crystal product which is protected from the noise of external current. Also, both ends of the cable are terminated with RCA terminals or terminals made of metal single crystals so that the cable is protected from noise when using as a connection in audio and video systems, thus increasing the quality of sound.

Although the method for forming the wire using the disc-shaped piece has been described herein, the disc-shaped piece may also be used as a unidirectional substrate or target for deposition, in which case it can be used a target having a size of 2, 3 or 4 inches. In order for the disc-shaped piece to have a precise outer diameter, the disc-shaped piece formed by electric discharge machining is re-machined to the desired diameter, or the copper single crystal is subjected to electric discharge machining to provide the desired outer diameter, so that it can be used as a target or substrate for deposition. This process is also within the scope of the present invention.

Figure 3:
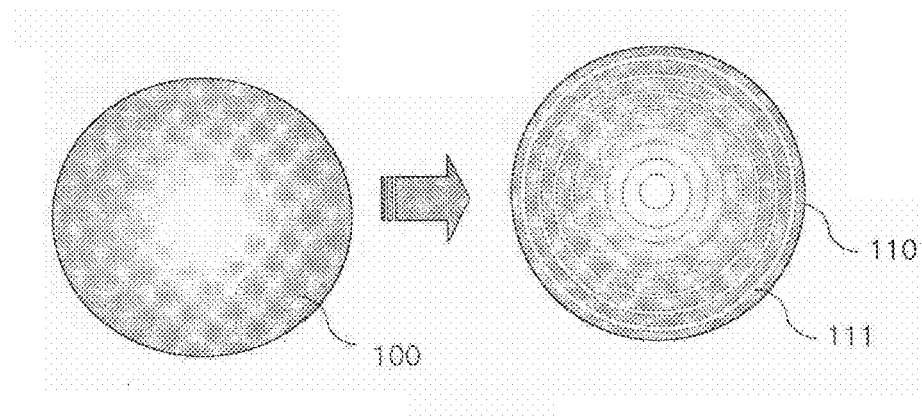
FIG. 3 is shows a disc-shaped single crystal piece and a press mold according to an embodiment of the present invention.

Although the method for producing the wire by electric discharge machining has been described above, the wire or similar products may also be produced using a press mold as shown in FIG. 3.

As shown in FIG. 3, a disc-shaped piece 100 produced by electric discharge machining is placed on a press mold 110 having the desired press pattern 111 formed thereon and then subjected to press machining, so as to form a wire or similar products having the same shape as the pattern 111 of the mold 110. More specifically, when the mold 110 having the press pattern 111 as shown in FIG. 3 is used, a plurality of elongated rings will be obtained, and when a mold having a press pattern continuously connected (e.g., a spiral or helix pattern) is used, a continuous elongated wire will be obtained.

The ring-shaped wire produced can be used as a ring or pendant, for example. The continuous wire is preferably subjected to post-machining, such as optical polishing, in the same manner as when producing the wire by milling operations, including electric discharge machining, so as to produce a single-crystal cable. Alternatively, the continuous wire is subjected to wet etching to remove an oxide film from the surface thereof so as to produce a single-crystal cable.

Figure 4:
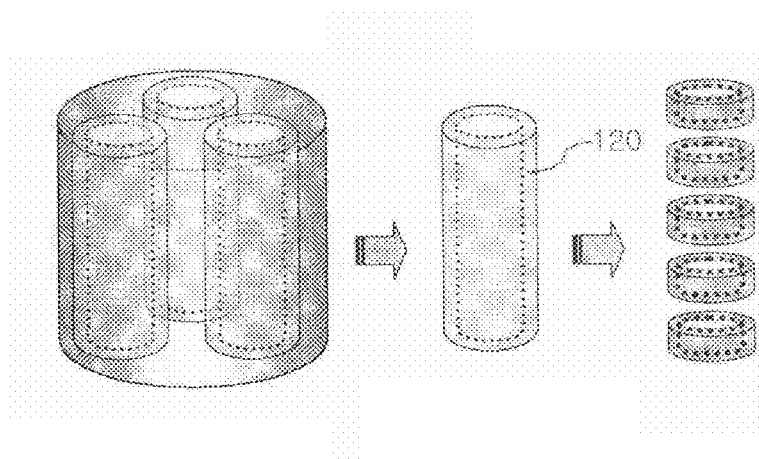
FIG. 4 shows the step of machining a single crystal piece into a ring shape, according to an embodiment of the present invention.

Although the continuous single crystal wire cable has been described above, the single crystal grown according to the Czochralski or Bridgman method as described above can be used to produce a highly pure metal ring. For this purpose, the upper surface of the single crystal grown as shown in FIG. 1 is cut with a wire-cut electric discharge machine. Then, as shown in FIG. 4, the resulting crystal is cut into a column shape using a wire electric discharge drill having a diameter of less than 0.5 mm and a wire-cut electric discharge machine. Then, the column-shaped material is subjected to electric discharge machining to form a cylindrical body 120, which is then cut in the horizontal direction to produce a highly pure metal ring. The machining of the metal using the electric discharge machine is performed using known technology. However, to prevent the oxidation of the product and to give high-added value to the product by fine machining, it is also possible to use spearhead machines, such as non-electric discharge machines.

The ring products manufactured according to the above method may be used as an aid for promoting human health. In the ring containing metal atoms arranged in one direction, a change in the magnetic field induced by an electric current in the ring or an eddy current induced by this change in the magnetic field will be increased compared to that in a general metal ring. Namely, in the ring having metal atoms arranged in one direction, factors interfering with electric current will be reduced owing to its structural stability so that the amount of electric current induced in the ring will be larger than that in a general metal ring. Thus, the amount of eddy current produced in the single crystal ring will stimulate the blood flow of the human body to make it smooth, and when biomagnetic changes caused by this change in the blood flow are accumulated over time, the change of the blood flow becomes more active compared to that of a person without wearing such a single crystal metal ring. The fact that smooth and active blood flow is favorable to the health of the human body is well supported by modern medical science.

In order to examine whether the high-purity single crystal products prepared by the above method overcomes the problems of the existing crystal structure, the single crystal wire produced using the copper-single crystal of the invention, and a conventional polycrystal copper wire cured in a molten state, were analyzed using XRD. The analysis results are shown in FIG. 5.

Figure 5:
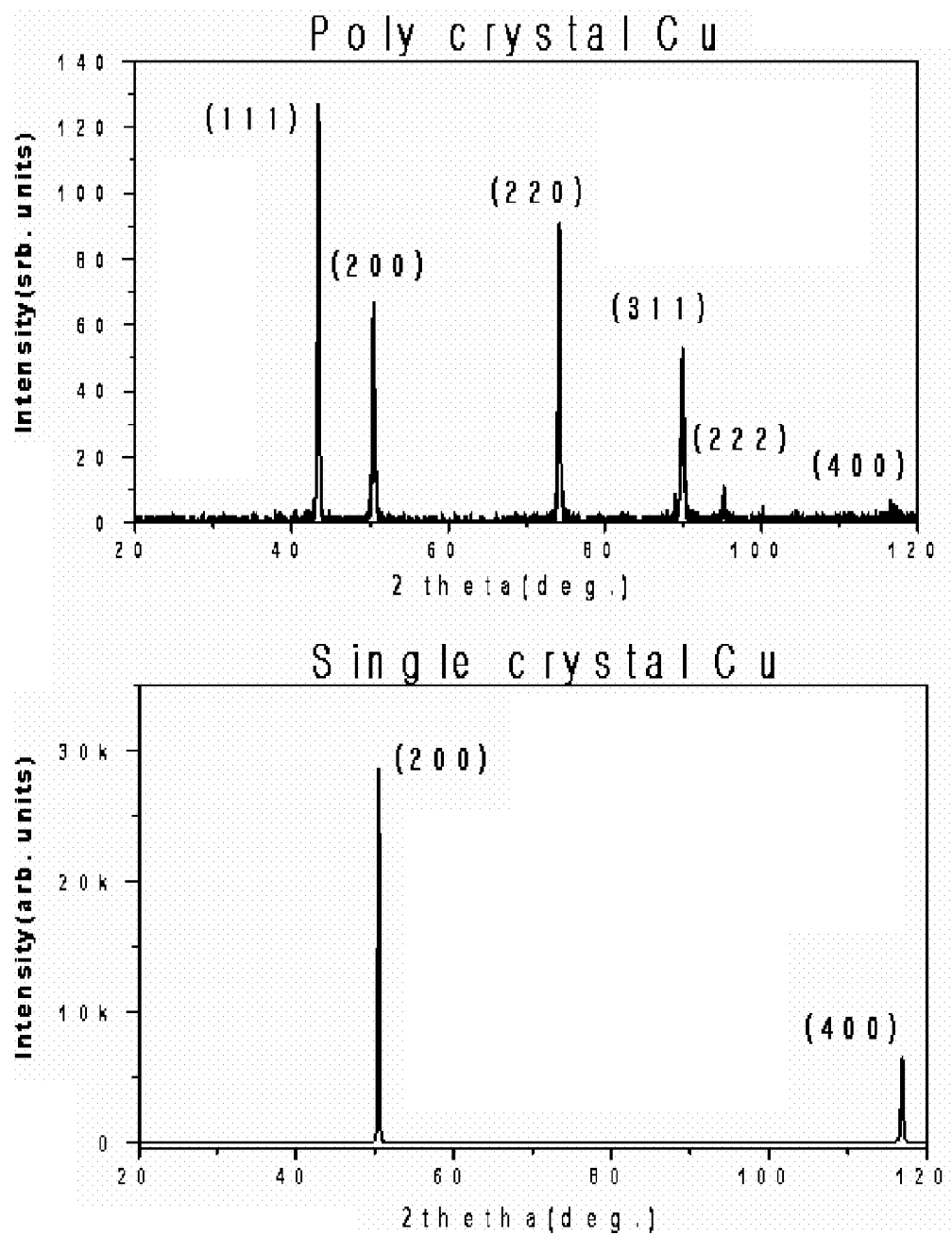
FIG. 5 shows XRD results for a copper single-crystal wire of the invention and a conventional polycrystal copper wire.

As can be seen in FIG. 5, the single-crystal wire produced by the above method had a unidirectional crystal structure similar to that of the seed crystal.

Also, to examine the contents of impurities required for use as a commercial wire, the polycrystal copper and the single crystal were analyzed by glow discharge spectroscopy, and the results are shown in FIG. 6.

As can be seen in FIG. 6, the produced single crystal had a purity of 5N, indicating that it can be used as a commercial-grade wire.

Figure 7:
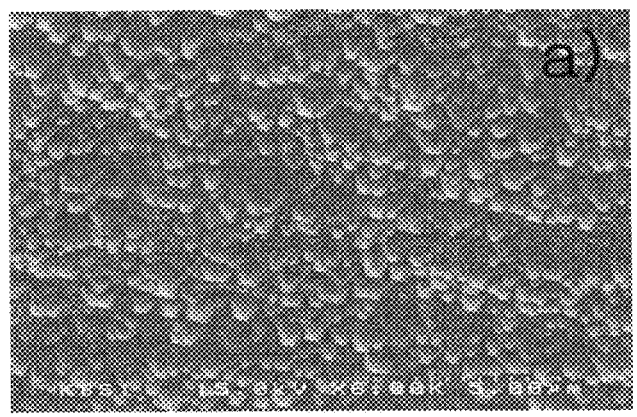
FIG. 7 shows surface image photographs of a copper single crystal wire of the invention (a) and a conventional polycrystal copper wire (b).
Figure 7:
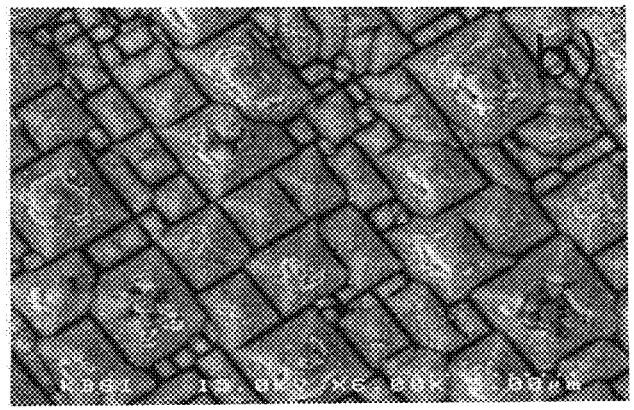

The surface of the produced single-crystal wire and the surface of a polycrystal copper wire were etched and the results are shown in FIG. 7.

As can be seen in FIG. 7, in the polycrystal wire, an etching pattern showing the crystal direction was not formed, but in the single-crystal wire, a square etched pattern showing the (100) direction was formed.

The above results suggest that the produced single crystal wire is a single crystal, which is highly pure and has a unidirectional crystal structure.

Figure 8:
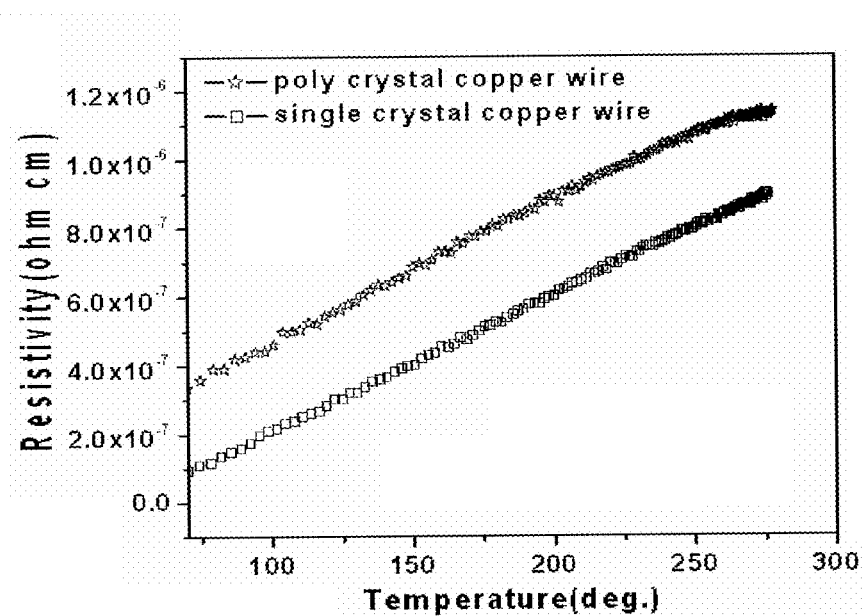
FIG. 8 shows the comparison of resistivity between a copper single crystal wire of the invention and a conventional polycrystal copper wire.

This single crystal wire was measured for resistivity with a change in temperature, and the results are shown in FIG. 8.

The resistivity of the polycrystal copper wire is known to be $1.7 \times 10^{-6}$ $\Omega$cm for highly pure copper. As can be seen in FIG. 8, however, the resistivity of the single crystal wire prepared according to the invention was $1.2 \times 10^{-7}$ $\Omega$cm and was much lower with a decrease in temperature than that of the polycrystal copper wire.

Figure 9:
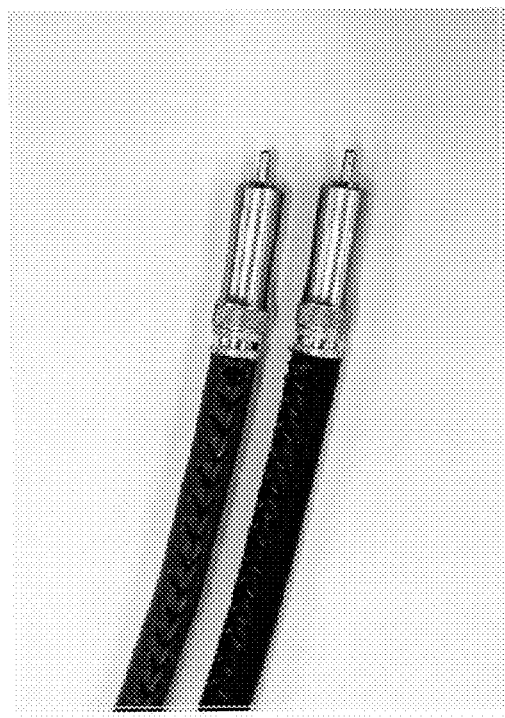
FIG. 9 shows sound cables produced by covering the outer surface of copper single crystal wires of the invention with insulation leather.

As shown in FIG. 9, the single crystal wire was finally covered with natural leather on the outer surface thereof. As a result, the inventive cable was markedly superior in sound signal transmission to the existing polycrystal product. This is demonstrated from results shown in FIG. 10.

Figure 10:
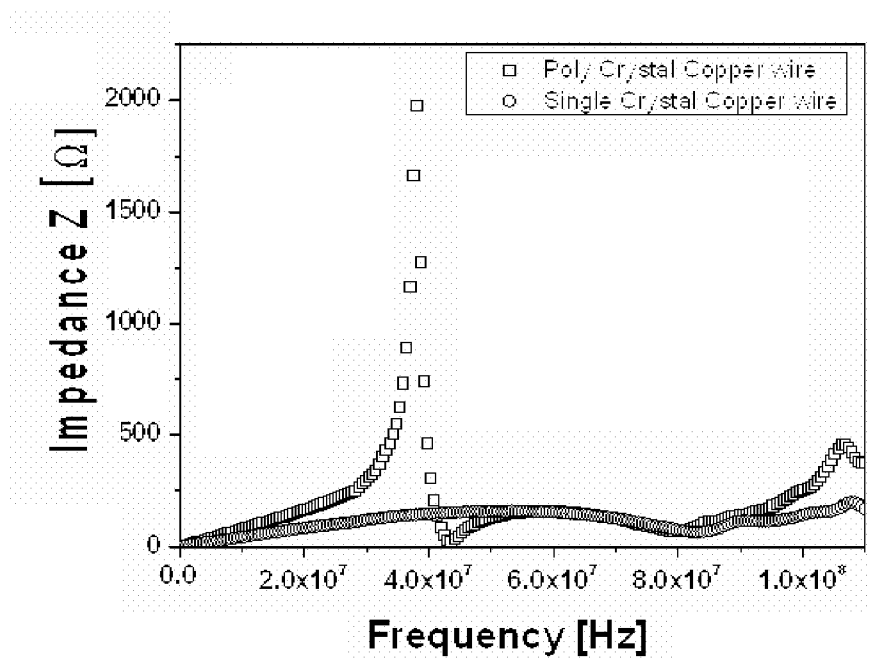
FIG. 10 shows the comparison of impedance as a function of frequency between a single crystal cable of the invention and a conventional polycrystal cable.

As can be seen in FIG. 10, in the single crystal wire, the inventive single crystal cable was completely protected from external sound and magnetic waves owing to the characteristics of the natural leather. Thus, the impedance as a function of frequency was constantly lower over the entire frequency region than that of the existing polycrystal cable.

The single crystal wire and other articles manufactured by the present invention and the manufacturing method thereof is applicable in various fields. Particularly, the present invention can be applicable for commercial-grade image and sound cables, precious metal rings and various medical accessories, and thus, is an excellent technology from an industrial point of view.

What is claimed is:

1. A method for manufacturing a conductive single crystal wire, comprising the steps of:
   placing in a growth crucible at least one metal selected from the group consisting of gold, copper, silver, aluminum and nickel;
   heating and melting the metal placed in the growth crucible;
   growing a single crystal using metal crystal as a seed by Czochralski or Bridgman method;
   cutting the grown single crystal by electric discharge machining into a plurality of single crystal discs having a predetermined thickness of an intended wire; and
   producing by electric discharge machining each of the cut single crystal discs into an elongated single crystal wire, wherein said electric discharge machining is performed either by cutting the single crystal disc in an inward spiral pattern from an outer surface into a center axis of the single crystal disc to produce the elongated single crystal wire with the predetermined thickness, or by firstly forming an axial central hole in a central axis of the single crystal disc, then cutting the single crystal disc in an outward spiral pattern from the axial central hole to the outer surface of the single crystal disc to produce the elongated single crystal wire with the predetermined thickness.

2. The method of claim 1, wherein the growth crucible is one selected from the group consisting of a graphite crucible, a boron nitride (BN) crucible, an alumina crucible, and a quartz crucible.

3. The method of claim 1, wherein the heating of the metal placed in the growth crucible is performed using an RF induction coil or a carbon heater.

4. The method of claim 1, which further comprises, after the cutting step, the step of polishing or wet-etching the single crystal.

5. The method of claim 1, wherein the wire is covered with synthetic resin on the outer surface thereof.

6. The method of claim 5, wherein the synthetic resin is covered with natural leather on the outer surface thereof.

7. The method of claim 5, wherein both ends of the wire are provided with terminals.

8. The method of claim 1, wherein the growth crucible has a double crucible structure formed of a graphite crucible at its outer side and another crucible selected from the group consisting of a boron nitride (BN) crucible, an alumina crucible, and a quartz crucible.

9. The method of claim 1, wherein the conductive single crystal wire is a conductive wire usable for cables.

10. A method for manufacturing a conductive single crystal wire, comprising the steps of:
    placing in a growth crucible at least one metal selected from the group consisting of gold, copper, silver, aluminum and nickel;
    heating and melting the metal placed in the growth crucible;
    growing a single crystal using metal crystal as a seed by Czochralski or Bridgman method;
    cutting the grown single crystal by machining into a plurality of single crystal discs; and
    producing, by press machining using a mold having a press pattern of spiral shape, each of the cut single crystal discs into an elongated single crystal wire.

11. The method of claim 10, wherein the growth crucible is one selected from the group consisting of a graphite crucible, a boron nitride (BN) crucible, an alumina crucible, and a quartz crucible.

12. The method of claim 10, wherein the growth crucible has a double crucible structure formed of a graphite crucible at its outer side and another crucible selected from the group consisting of a boron nitride (BN) crucible, an alumina crucible, and a quartz crucible.

13. A method for manufacturing a conductive single crystal ring, comprising the steps of:
    placing in a growth crucible at least one metal selected from the group consisting of gold, copper, silver, aluminum and nickel;
    heating and melting the metal placed in the growth crucible;
    growing a single crystal using metal crystal as a seed by Czochralski or Bridgman method;
    cutting the grown single crystal by machining into a plurality of single crystal discs; and
    producing, by press machining using a mold having a press pattern of concentric circles, each of the cut single crystal discs into a plurality of elongated single crystal rings.

14. The method of claim 13, wherein the growth crucible is one selected from the group consisting of a graphite crucible, a boron nitride (BN) crucible, an alumina crucible, and a quartz crucible.

15. The method of claim 13, wherein the growth crucible has a double crucible structure formed of a graphite crucible at its outer side and another crucible selected from the group consisting of a boron nitride (BN) crucible, an alumina crucible, and a quartz crucible.

* * * * *